United States Patent [19]
Ryum et al.

[11] Patent Number: 5,798,277
[45] Date of Patent: Aug. 25, 1998

[54] METHOD FOR FABRICATING HETEROJUNCTION BIPOLAR TRANSISTOR

[75] Inventors: Byung-Ryul Ryum; Tae-Hyeon Han; Deok-Ho Cho; Soo-Min Lee; Kwang-Eui Pyun, all of Daejeon, Rep. of Korea

[73] Assignees: Electronics and Telecommunications Research Institute, Daejeon; Korea Telecommunication Authority, Seoul, both of Rep. of Korea

[21] Appl. No.: 729,841

[22] Filed: Oct. 15, 1996

[30] Foreign Application Priority Data

Dec. 20, 1995 [KR] Rep. of Korea .............. 95-52690

[51] Int. Cl.⁶ .................................................. H01L 21/265
[52] U.S. Cl. ................... 437/31; 437/67; 437/131; 437/132; 148/DIG. 50; 148/DIG. 72
[58] Field of Search ............... 437/31, 67, 131, 437/132; 148/DIG. 10, DIG. 11, DIG. 50, DIG. 72

[56] References Cited

U.S. PATENT DOCUMENTS 4,980,305  12/1990  Kadota et al. ............... 437/31
5,039,624   8/1991  Kadota .................. 148/DIG. 10
5,496,745   3/1996  Ryum et al. ........... 148/DIG. 10

Primary Examiner—John Niebling
Assistant Examiner—Long Pham
Attorney, Agent, or Firm—Antonelli, Terry, Stout & Kraus, LLP

[57] ABSTRACT

An improved method for fabricating a heterojunction bipolar transistor which includes the steps of forming a buried collector, a collector thin film, and a collector sinker on a semiconductor substrate in order, forming a first silicon oxide film, a base electrode polysilicon layer, a nitride film, and an oxidation film on a resulting substrate exposing the first silicon oxidation film, forming a spacer insulation film at the lateral side of the exposed region, and defining an activation region, exposing the collector thin film of the activation region using a mask, and forming an auxiliary lateral film for an isolation of the device, forming a selective collector region by ion-implantating a dopant to the activation region which is limited by the auxiliary lateral film, removing the auxiliary lateral film, etching the exposed portion in an anisotropic etching method, and forming a shallow trench for a device isolation, forming a polysilicon lateral film to have a height which is the same as the height of the base electrode polysilicon layer on the shallow trench, and forming a self-aligned base.

4 Claims, 6 Drawing Sheets

1

METHOD FOR FABRICATING HETEROJUNCTION BIPOLAR TRANSISTOR

BACKGROUND OF THE INVENTION

1. Field of the Invention

The present invention relates to a method for fabricating a heterojunction bipolar transistor, and in particular to an improved method for fabricating a heterojunction bipolar transistor which is capable of forming a base with an epitaxial growth method instead of using an ion implantation or a dopant diffusion method, and is capable of concurrently performing a device isolation process, a collector-base self-alignment, and a selective collector ion implantation process using a single mask.

2. Description of the Prior Art

Generally, the homojunction bipolar transistor has advantages in that its size is compact, and the operational speed is high; however, since the density of the dopants of the emitter and the base is increased, there is a predetermined limit of improvement to the characteristics of the device using an existing construction of the transistor.

In order to overcome the above-mentioned problems, a heterojunction bipolar device was introduced in the industry.

The heterojunction bipolar device has a characteristic that the energy bandgap of the emitter is wider than that of the base, thus achieving a desired performance of the device. Recently, a method of reducing the energy bandgap by adding Ge to the base layer using Si during the homojunction bipolar device fabrication process has been studied.

The conventional heterojunction bipolar device is directed to concurrently using a polysilicon thin film such as a homojunction Si bipolar device as a base electrode, an emitter, and an emitter dopant diffusion source, thus increasing emitter injection efficiency by forming a predetermined energy gap difference between the emitter and the base and thus enhancing the current gain and the switching speed of the device.

As the construction of the device is optimized and downsized, there has been introduced various kinds of methods for minimizing various parasitic parameters such as a base resistance which exists in the active region of the device and the parasitic capacitance between the collector and the base.

Among the above-mentioned methods, there is a trench isolation method, a local oxidation of silicon (LOCOS), and a selective epitaxial growth (SEG) method of a SiGe base thin film.

In addition, a method of using a metallic thin film instead of using a polycrystalline Si as the base electrode such as a $TiSi_2$ for more reducing of the base parasitic resistance, which is caused at the polycrystalline Si thin film which is the base electrode material, has been intensively studied in the industry.

LOCOS has a disadvantage in that since a thermal oxidation film is horizontally formed having a thickness as much as the thickness of a Si thermal oxidation film which is vertically formed, there is a limit to the geometrical reduction of the device.

FIG. 1 is a cross-sectional view showing a super magnetic alignment Si/SiGe heterojunction bipolar transistor which is directed to using the selective thin film growth method with respect to a SiGe base thin film, and not using LOCOS.

In more detail, FIG. 1 is a cross-sectional view showing an npn Si/SiGe heterojunction bipolar device which is formed by self-aligning the collector-base in the conventional selective base thin film growth method after forming the base thin film.

An $n^+$ buried type Si collector layer 1-2, which has a high dopant density, is formed on a p-type Si substrate 1-1, and an $n^-$ Si collector thin film 1-3, which has a low dopant density is formed on the $n^+$ buried type Si collector layer 1-2.

Thereafter, an $n^+$ type dopant ion is implantated, and a connection section 1-4 is formed, and a trench is formed in a dry etching of a Si layer so as to isolate devices, and a boron phosphorous silica glass (BPSG) insulation film 1-5 containing Boron and Phosphorous therein is filled in the trench.

An insulation film 1-5 is flattened at a high voltage environment.

Thereafter, an insulation film 1-6, a $p^+$ polycrystal Si film 1-7, an insulation film 1-8 and a lateral insulation film 1-9 are doped and etched as shown in FIG. 1, and an ion implantation is selectively performed with respect to the active region of the device, and an n-type collector region 1-10 is formed in a high current region so as to enhance the characteristic of the device.

Next, a SiGe base 1-11 is selectively formed in the region, in which a Si collector 1-10 and a polycrystalline Si base electrode 1-7 are exposed, in a gas source molecular beam method, and a polycrystalline Si thin film 1-12 is selectively formed in the residual region, and the base electrode polycrystalline Si 1-7 and the SiGe base 1-11 are connected to each other.

Therefore, the region of the parasitic capacitance in which the collector and the base are formed is defined as the region of a thin film 1-12, and can be made smaller with a photoresistive film, so that a magnetic alignment is made between the collector and the base.

However, since the region of the parasitic capacitance which is defined by the polycrystalline Si thin film 1-12 is defined by a horizontal etching with respect to the insulation film 1-6, the uniformity, reproducibility, and performance of the device may be degraded, and instability in the fabrication process may occur, thus causing a critical damage with respect to the device.

In addition, since the selective thin film growth method which has the slowest growth speed is used two times for the growth of the base thin film 1-11 and the connection thin film 1-12, and the crystalline thin film 1-11 and the polycrystalline Si thin film 1-12 are different in their respective material, the fabrication processes are made complex, and if the polycrystalline Si thin film 1-12 is formed on the base thin film 1-11, critical damage may occur in the device, and it is impossible to accurately control the fabrication process of the device.

Therefore, it is impossible to achieve the economic fabrication of the device in connection with a throughput, each of processing, and the reproducibility of the device.

FIG. 2 is a cross-sectional view of a Si/SiGe heterojunction bipolar device after a base thin film growth which is fabricated in another conventional fabrication method without using the trench.

As shown therein, the above-described method is directed to simplifying the fabrication process and integrating the device by using the selective thin film growth method with respect to the base as well as the collector thin film without using the trench process.

An $n^+$ type collector 2-2 is formed on a p-type substrate 2-1, and an insulation film 2-3 and a base electrode polycrystalline Si thin film 2-4 are deposited thereon in order. A photoresistive film mask and the thin film 2-4 are etched to define a base electrode region.

Thereafter, an insulation film 2-5 is doped, and the photoresistive mask and the thin films 2-5, 2-4, and 2-3 are etched to define an active region.

A collector N-type Si thin film 2-6 and a base Si Ge thin film 2-7 are formed by sequentially adding a dopant thereto.

When forming the thin films 2-6 and 2-7, a polycrystalline or non-armophous Si thin films 2-6-1 and 2-7-1 are formed at the lateral side of the device.

However, in accordance with the above-described methods, since a predetermined path is formed, through which a current conducts through at the thin film 2-6-1 through the lateral film 2-7-1, a short circuit may occur between the collector and the emitter, which does not have sufficient current magnitude to qualify as current leakage. In addition, when current conducts in the thin film 2-6 through the thin films 2-7-1 and 2-6-1, a short circuit may occur between the emitter and the base or the base and the collector.

In addition, when selectively forming the collector thin film 2-6, since the thin film 2-6-1 is laterally formed, as the thickness of the thin film 2-6 is made thicker, the lateral growth is increased, so that the active region of the device which is defined by the monocrystalline thin films 2-7, 2-6, and 2-2 is not clearly defined.

FIG. 3 is a cross-sectional view showing another conventional npn Si/SiGe heterojunction bipolar device after a base thin film growth.

As shown therein, a n$^+$ buried type collector layer 3-2 having a high density dopant is formed on a p-type Si substrate 3-1.

A n$^-$ Si collector thin film 3-3 having a low density dopant is formed, and a trench is formed with a dry etching method with respect to the Si layer so as to isolate devices.

An oxidation film 3-4 is formed, and a p$^+$ polycrystalline Si thin film 3-5 is filled in the trench.

Thereafter, the thin film 3-5 is flattened at a high voltage environment.

An n-type ion dopant is implantated, and a Si oxidation film 30-7 and a p$^+$ polycrystalline Si film 3-8 as shown in FIG. 3 are doped and etched after forming a collector connection section 3-6.

Thereafter, a SiGe base 3-9 is formed in a ultra high vacuum chemical vapor deposition method, and the thin film 3-9 and the thin film 3-9 are etched and patterned, and a Si oxidation film 3-10 is doped.

In this case, since SiGe component is not formed at the lateral side of the Si oxidation film 3-8, a single layer structure formed of SiGe is not used. Namely, a double structure formed of Si/SiGe is used.

In addition, since the thickness of the thin film 3-9 is 60 nm, and the thickness of the thin film 3-8 is 0.5 nm, the resistance of the thin film 3-9 at the lateral side of the thin film 3-8 is high, and thermal damage may occur in the device, causing degrading the performance of the device.

As shown in FIG. 1, since a deep trench is formed, it is impossible to reduce the size of the device, and the filling process requires a long time.

SUMMARY OF THE INVENTION

Accordingly, it is an object of the present invention to provide a method for fabricating a heterojunction bipolar transistor which overcomes the problems encountered in the conventional heterojunction bipolar transistor.

It is another object of the present invention to provide an improved method for fabricating a heterojunction bipolar transistor which is capable of forming a base using an epitaxial growth method in place of using an ion implantation or a dopant diffusion method, and is capable of concurrently performing a device isolation process, a collector-base self-alignment, and a selective collector ion implantation process using a single mask.

It is another object of the present invention to provide a method for fabricating a heterojunction bipolar transistor which is capable of enhancing productivity by simplifying the fabrication processes and reducing the collector-base parasitic capacitance.

To achieve the above objects, there is provided a method for fabricating a heterojunction bipolar transistor which includes the steps of a first step of forming a buried collector, a collector thin film, and a collector sinker on a semiconductor substrate in order; a second step of forming a first silicon oxide film, a base electrode polysilicon layer, a nitride film, and an oxidation film on the result of the first step; a third step for exposing the first silicon oxidation film with photolithography method, forming a spacer insulation film at the lateral side of the exposed region, and defining an activation region; a fourth step of exposing the collector thin film of the activation region using the result of the third step as a mask, and forming an auxiliary lateral film for isolation of the device; a fifth step of forming a selective collector region by ion-implantating a dopant to the activation region which is limited by an auxiliary lateral film; a sixth step of removing the auxiliary lateral film, etching the exposed portion in an anisotropic etching method, and forming a shallow trench of a device isolation; a seventh step of forming a polysilicon lateral film to have a predetermined height which is the same as the height of the base electrode polysilicon layer on the shallow trench; and an eighth step of forming a self-aligned base.

In addition, in the present invention, the formation processes of a shallow trench and a polysilicon lateral side film, a self-aligned collector-base, and a selective collector region by the selective collector ion implantation are performed by one mask without using its exclusive mask, thus achieving an easier fabrication process and simplifying the fabrication process of the device. In addition, the shallow trench is used for the device isolation process instead of using the conventional deep trench, thus simplifying the isolation process. It is possible to prevent the increase of the base parasitic resistance by the polysilicon lateral film formed on the upper portion of the shallow trench. It is possible to prevent the formation of the parasitic capacitance at the lower portion of the polysilicon lateral film in cooperation with the shallow trench.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention is directed to forming a base by a selective epitaxial growth method in place of using an ion implantation or a dopant diffusion.

Figure 4:
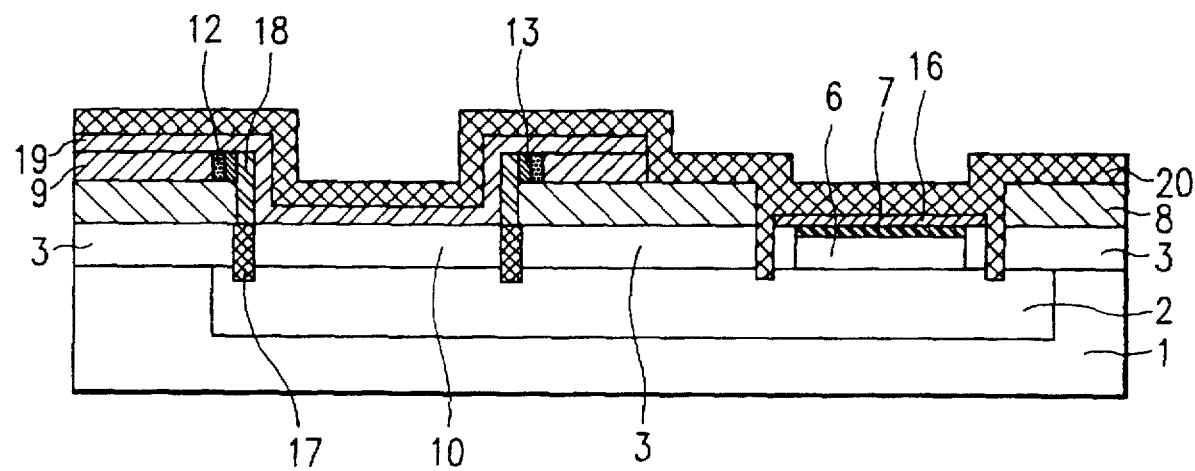
FIG. 4 is a cross-sectional view showing a heterojunction bipolar transistor according to the present invention.

Referring to FIG. 4, which is a cross-sectional view of a bipolar transistor according to the present invention, the characteristics of the present invention will now be explained.

Figure 1:
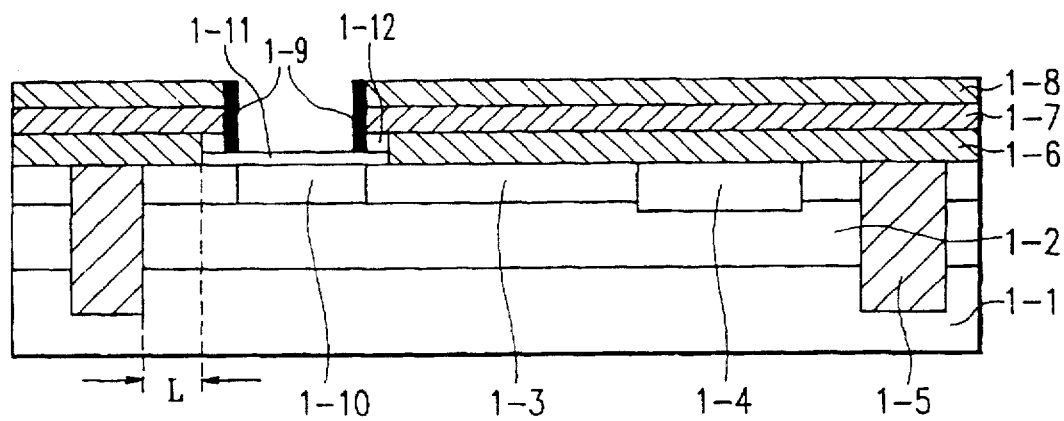
FIG. 1 is a cross-sectional view showing a heterojunction bipolar device formed by self-aligning a collector-base in a conventional selective base thin film growth method after a base thin film growth.
Figure 2:
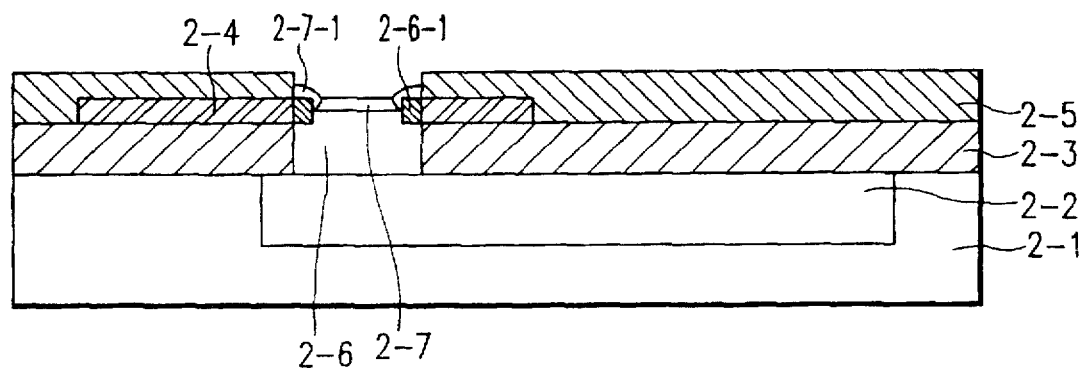
FIG. 2 is a cross-sectional view showing a heterojunction bipolar device formed by self-aligning a collector-base in another conventional selective base thin film growth method after a base thin film growth.
Figure 3:
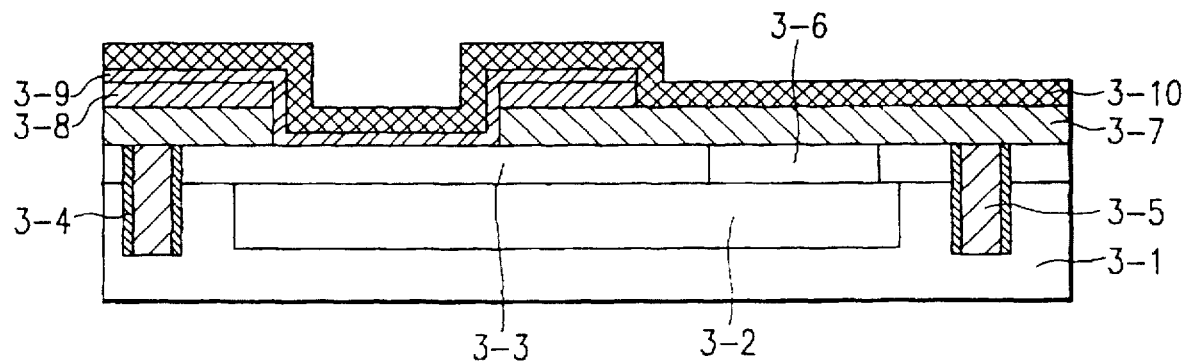
FIG. 3 is a cross-sectional view showing a heterojunction bipolar device formed by forming a base thin film in another conventional method after a base thin film growth.

First, the present invention is directed to using a shallow trench 17 compared to the deep trench which is shown in FIGS. 1 and 3, thus simplifying an isolation process and achieving an easier process.

In addition, the base parasitic resistance is significantly reduced by a polysilicon spacer 18 formed at the upper portion of the shallow trench 17, and the parasitic capacitance formation at the polysilicon spacer 18 is prevented by the shallow trench 17.

Moreover, the formation processes of the shallow trench 17 and the polysilicon lateral film 18, the formation process of the self-aligned collector-base, and the formation process of a selective collector region 10 by a selective collector ion implantation are performed using one mask in cooperation with a silicon oxidation film 12 and a silicon nitride film 13, thus achieving an easier and more simplified fabrication process of the device.

The fabrication method of the heterojunction bipolar transistor according to the present invention will now be described with reference to FIGS. 5A through 5J.

Figure 5A:
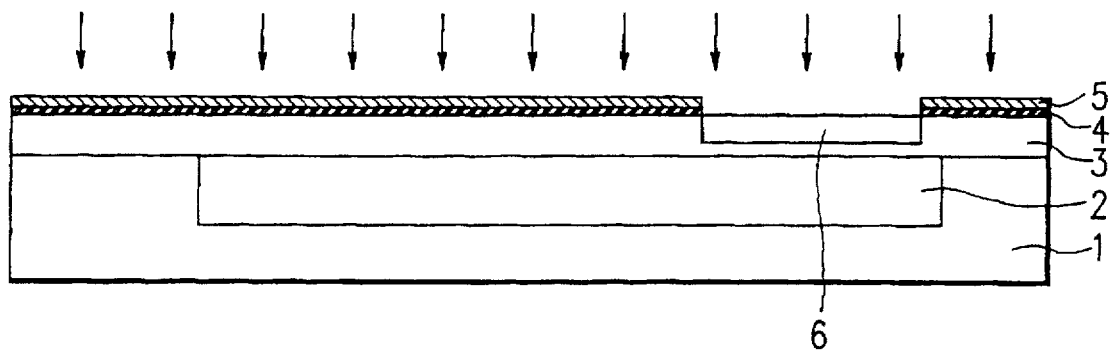
FIGS. 5A through 5J are cross-sectional views showing a fabrication method of a bipolar transistor according to the present invention.

First, referring to FIG. 5A, a Si oxidation film is doped on a p-type Si substrate 1, and is etched using a photoresistive film as a mask.

Thereafter, the photoresistive film is removed, and dopant ion implantation and heat treatment processes are performed using the Si oxidation film as a mask so as to form a buried collector 2.

The Si oxidation film which is used as a mask is removed, and a collector Si film 3 is deposited, and thereafter, a thermal oxidation Si film 4 and a nitride Si film 5 are deposited in that order.

The oxidation film 4 and the nitride film 5 are patterned using the photoresistive film as a mask, and a dopant is added by an ion implantation using the oxidation Si film 4 and the nitride Si film 5, which are formed at a defined region, as a mask, and then an n⁺ type collector region 6 is formed.

Figure 5B:
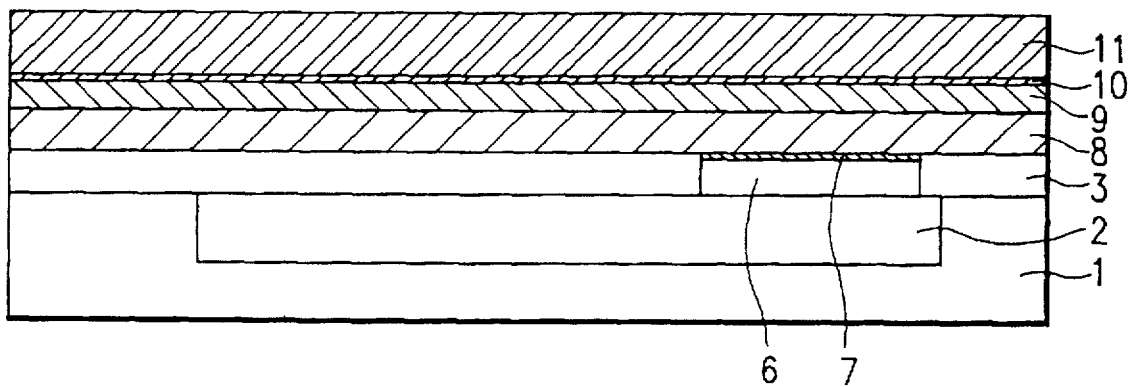

As shown in FIG. 5B, a heat treatment process is performed for the activation of a dopant in the collector region 6 and the formation of the thermal oxidation Si film 7.

Thereafter, a Si oxidation film 8 and a conductive polysilicon layer 9 for base electrode, the Si nitride film 10, and the Si oxidation film 11 are deposited in order.

Here, the polysilicon layer 9 is doped in-situ with a p type dopant so as to simplify the fabrication processes of the device.

Figure 5C:
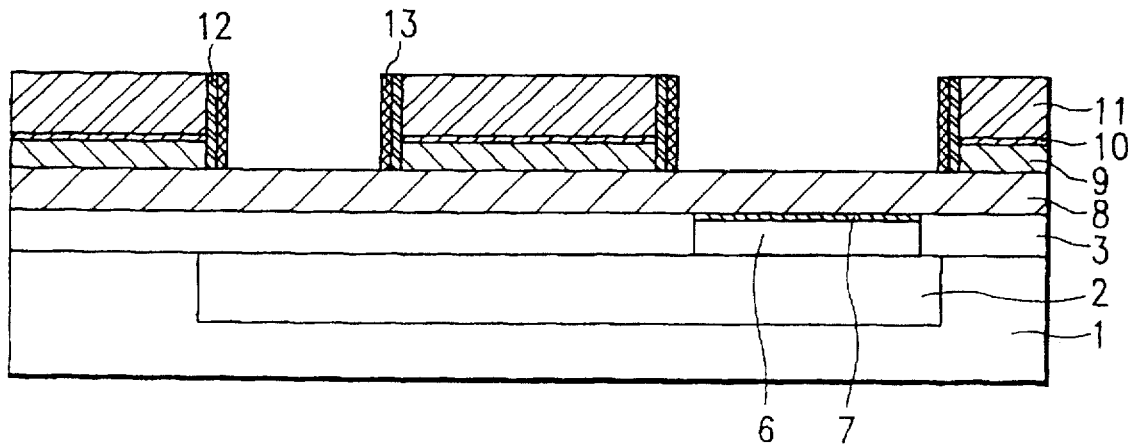

Referring to FIG. 5C, an active region of the device is defined.

In more detail, the Si oxidation film 11, the Si nitride film 10, and the doped polysilicon layer 9 are etched in order, and the photoresistive film is removed using the photoresistive film, which defines the active region, as a mask.

Thereafter, a insulating spacer is formed by an anisotropic etching with respect to the lateral side of the etched layers 11, 10, and 9.

Here, a double layer formed with the Si nitride film 12 and the Si oxidation film 13 which have a different etching rate in cooperation with the spacer insulation film, is formed so as to enhance the reliability of the device.

Figure 5D:
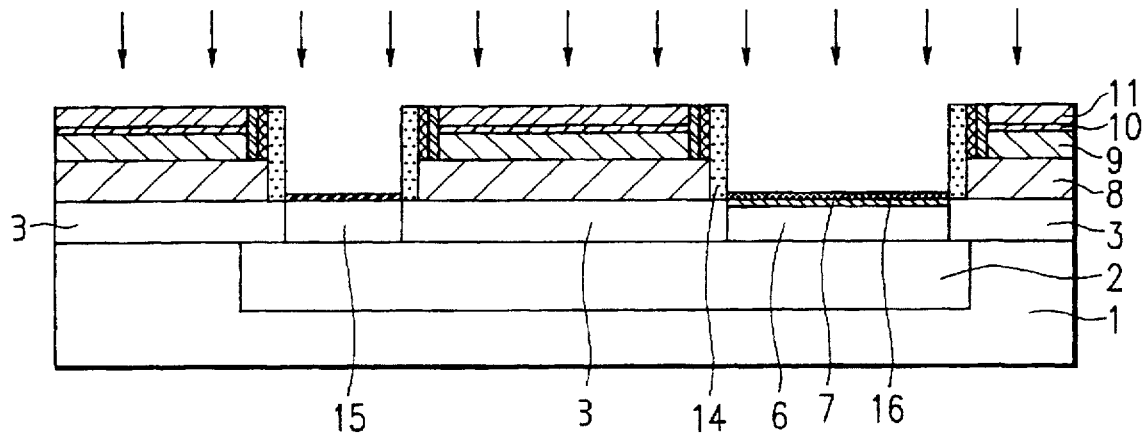

As shown in FIG. 5D, the Si oxidation film 8, which is exposed through the above-described process, is etched.

The Si oxidation film 11, which serves as a, mask is etched to a thickness of the etched thickness of the thin film 8.

A preliminary spacer 14 is formed, and the dopant is added to the exposed collector thin film 3 by an ion implantation method, and the collector region 15 is selectively formed.

The density of the dopant implanted in the collector region 15, is lower than that of the dopant which is used when forming the collector region 6. Namely, the n-type dopant is used therefor.

An oxidation film 16, which serves as a mask when isolating the device, is formed.

Figure 5E:
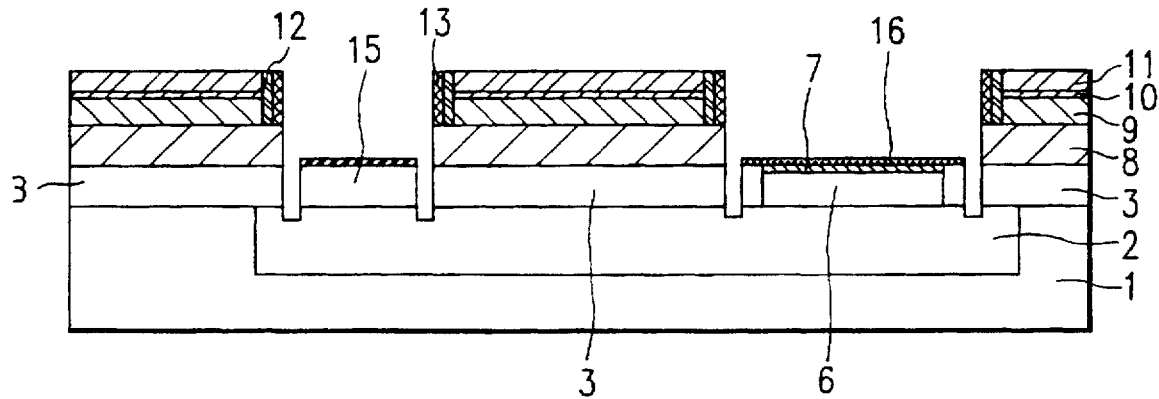

As shown in FIG. 5E, the preliminary spacer 14 is removed, and the exposed Si film is etched, and a shallow trench is formed.

Figure 5F:
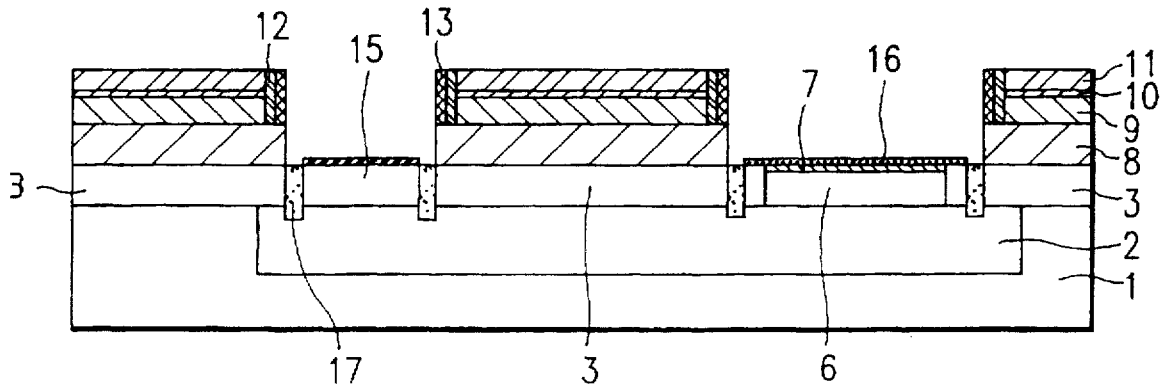

As shown in FIG. 5F, a shallow trench 17 is formed so as to isolate the device by filling the Si oxidation film in the trench.

In this embodiment, the device isolation is made possible using the shallow trench 17 which is shallower and smaller than that of the conventional trench in cooperation with the spacer insulation films 12 and 13.

Figure 5G:
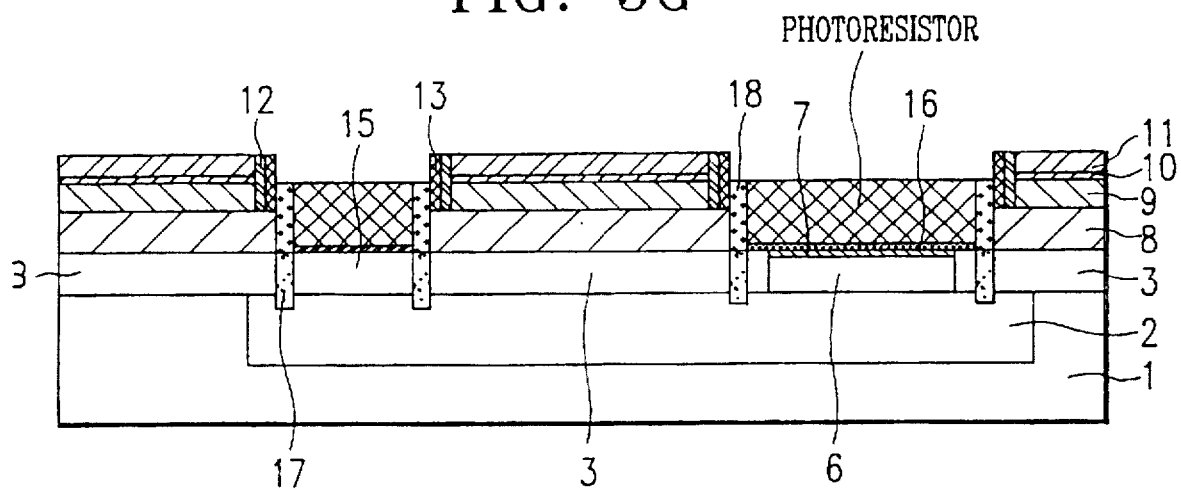

As shown in FIG. 5G, a p⁺ polysilicon is deposited on the upper portion of the shallow trench 17, and a polysilicon spacer 18 is formed with an anisotropic dry etching method.

Here, the height of the polysilicon spacer 18 is made identical with the height of the doped polysilicon layer 9 in the flattening process after doping the photoresistive film.

In addition, the doping of the polysilicon spacer 18 is preferably doped with an in-situ method with respect to the p-type dopant when forming the thin film.

Figure 5H:
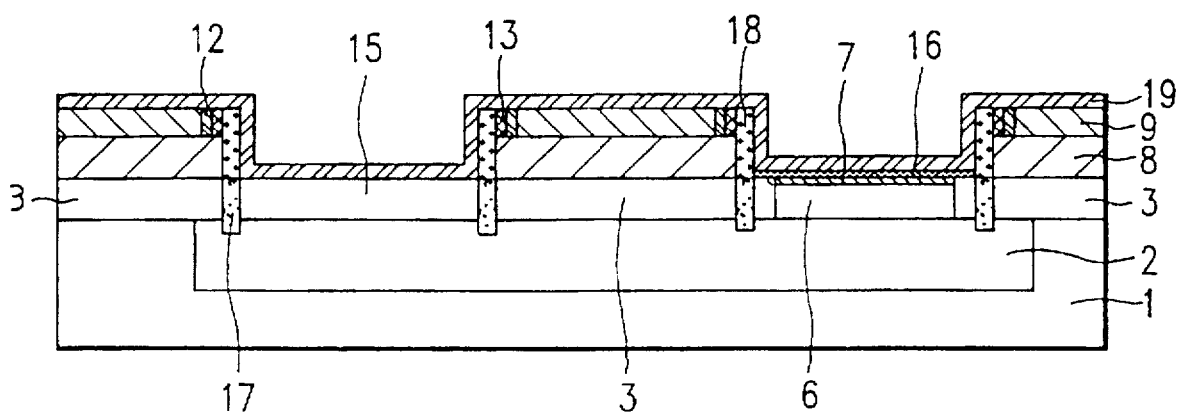

As shown in FIG. 5H, the entire portion of the insulation layers 10 and 11, and a partial portion of the lateral side insulation layers 12 and 13 are etched, the polysilicon layer 9 is exposed, and a photoresistive film are removed. Thereafter, the base thin film 19 is deposited at the front surface of the result of the removal of the photoresistive film.

The base thin film 19 is preferably formed in a triple heterojunction structure composed of Si/SiGe/Si for the operational speed of the device.

Here, it is possible to control the amounts of Ge and the dopant of Si/SiGe/Si of the base thin film 19. In addition, it is possible to control the density of Boron. The base thin film 19 formed on the polysilicon layer 9 and the lateral side insulation films 12, 13 and 18 have a polycrystalline characteristic, and a monocrystalline thin film is formed on the collector region 15.

Figure 5I:
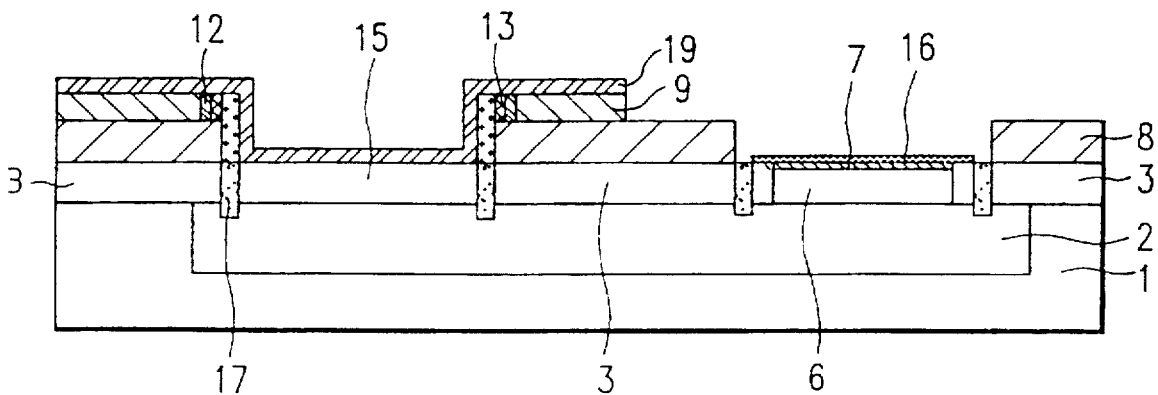

FIG. 5I shows a step of removing the thin films 19, 12, 13, 18, and 19 using the photoresistive film, which defines the base electrode, as a mask.

Figure 5J:
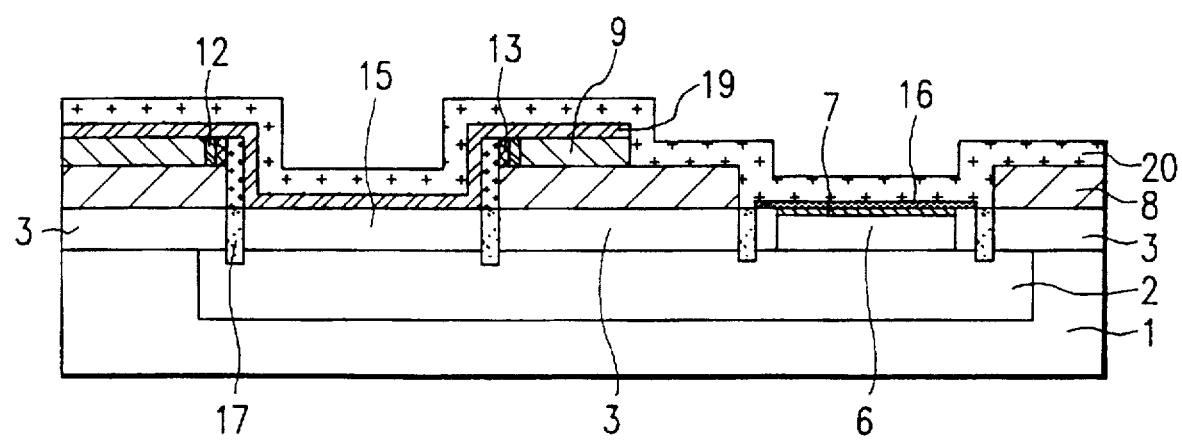

Finally, an insulation film 20 is formed on the result of the above process, and the construction shown in FIG. 5J is obtained.

As described above, in the present invention, the formation processes of the shallow trench 17 and the polysilicon lateral side film 18, the self-aligned collector-base, and the selective collector region 10 by the selective collector ion implantation are performed by one mask without using its exclusive mask, thus achieving an easier fabrication process and simplifying the fabrication process of the device. In addition, the shallow trench 17 is used for the device isolation process instead of using the conventional deep trench, thus simplifying the isolation process. It is possible to prevent the increase of the base parasitic resistance by the polysilicon lateral film 18 formed on the upper portion of the shallow trench 17. It is possible to prevent the formation of the parasitic capacitance at the lower portion of the polysilicon lateral film 18 in cooperation with the shallow trench 17.

In addition, in accordance with the present invention, the operational speed of the device is increased in cooperation with the Si/SiGe heterojunction thin film, and the device isolation process using the shallow trench, the self alignment of the collector-base, and the selective collector ion implantation process, which is directed to adding a dopant to the collector in the activation region of the device, are concurrently performed by using one mask, thus simplifying the fabrication process of the device, reducing the parasitic capacitance of the collector-base, and increasing the blocking frequency and maximum oscillation frequency of the device.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method for fabricating a heterojunction bipolar transistor, comprising the steps of:

a first step of forming a buried collector, a collector thin film, and a collector region on a semiconductor substrate in order;

a second step of sequentially forming a first silicon oxide film, a polysilicon layer for forming a base electrode, a nitride film, and an oxidation film on a first structure formed as a result of the first step;

a third step of exposing the first silicon oxidation film by etching, forming a first insulating spacer at a lateral side of an exposed region of the first silicon oxidation film, thereby defining an active region;

a fourth step of exposing the collector thin film in the active region using a second structure formed as a result of the third step as a mask, and forming a second spacer on the collector film for isolating of the transistor, and forming a masking thermal oxide over a collector depression;

a fifth step of selectively forming the collector region by ion-implanting a dopant to the active region which is defined by the second spacer;

a sixth step of removing the second spacer, anisotropic etching to remove a portion of buried collector to form a trench and filling the trench with oxide for device isolation;

a seventh step of forming a polysilicon spacer to have a height which is the same as a height of the polysilicon layer for a base electrode on the trench;

an eighth step of exposing the polysilicon layer and the collector thin film by removing the nitride film and the masking thermal oxide, and forming a self-aligned base layer on the oxidation film; and a ninth step of sequentially removing a part of the base layer, the polysilicon layer, the insulating spacer and the polysilicon spacer except for a base electrode region using a mask defining the base electrode, and depositing a passivation layer on a removed part of the base layer, the polysilicon layer, the insulating spacer and the polysilicon spacer except for the base electrode region.

2. The method of claim 1, wherein in the first step, after forming the collector region, a heat treatment step is further included so as to form an oxidation film on an upper portion thereof and a dopant activation of the collector region.

3. The method of claim 1, wherein in the third step, the insulating spacer is formed with a double layer composed of a silicon nitride and a silicon oxide which have a different etching rate for enhancing the reliability of the device.

4. The method of claim 1, wherein in the eighth step, the base layer is formed with a triple film composed of Si/SiGe/Si.

* * * * *